United States Patent
Beck et al.

(10) Patent No.: US 6,653,834 B2
(45) Date of Patent: Nov. 25, 2003

(54) MAGNETIC RESONANCE IMAGING METHOD

(75) Inventors: Gabriele Marianne Beck, Eindhoven (NL); Romhild Martijn Hoogeveen, Eindhoven (NL); Paul Royston Harvey, Eindhoven (NL); Johan Samuel Van Den Brink, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 25 days.

(21) Appl. No.: 10/014,861

(22) Filed: Nov. 13, 2001

(65) Prior Publication Data

US 2002/0114502 A1 Aug. 22, 2002

Related U.S. Application Data

(63) Continuation-in-part of application No. 09/817,097, filed on Mar. 26, 2001.

(30) Foreign Application Priority Data

Nov. 14, 2000 (EP) .............................. 00203990

(51) Int. Cl.⁷ ................................. G01V 3/00
(52) U.S. Cl. ....................... 324/309; 324/307
(58) Field of Search ................................ 324/309, 307, 324/311, 312, 318, 322; 128/653.3; 600/410, 420; 382/131, 6

(56) References Cited

U.S. PATENT DOCUMENTS

| | | | | |
|---|---|---|---|---|
| 5,162,736 A | * | 11/1992 | Mansfield et al. | 324/309 |
| 5,390,458 A | * | 2/1995 | Levin | 382/6 |
| 5,546,472 A | * | 8/1996 | Levin | 382/131 |
| 5,713,358 A | | 2/1998 | Mistretta et al. | 128/653 |
| 6,026,316 A | * | 2/2000 | Kucharczyk et al. | 600/420 |
| 6,195,579 B1 | * | 2/2001 | Carroll et al. | 600/420 |
| 6,448,771 B1 | * | 9/2002 | Harvey et al. | 324/307 |
| 6,493,569 B2 | * | 12/2002 | Foo et al. | 600/410 |

* cited by examiner

Primary Examiner—Edward Lefkowitz
Assistant Examiner—Brij B. Shrivastav
(74) Attorney, Agent, or Firm—John Vodopia

(57) ABSTRACT

A magnetic resonance imaging method is provided in which the magnetic resonance signals are acquired by sampling a selected region in the k-space. The selected region in the k-space is chosen in dependence on the object or structure to be imaged. In particular an anisotropic central sector in the k-space is chosen, its axis being dependent on the spatial orientation of the object or structure to be imaged. The magnetic resonance imaging method in accordance with the invention is particularly suitable for imaging arteries separately from veins in magnetic resonance angiography.

8 Claims, 3 Drawing Sheets

MAGNETIC RESONANCE IMAGING METHOD

Figure 1:
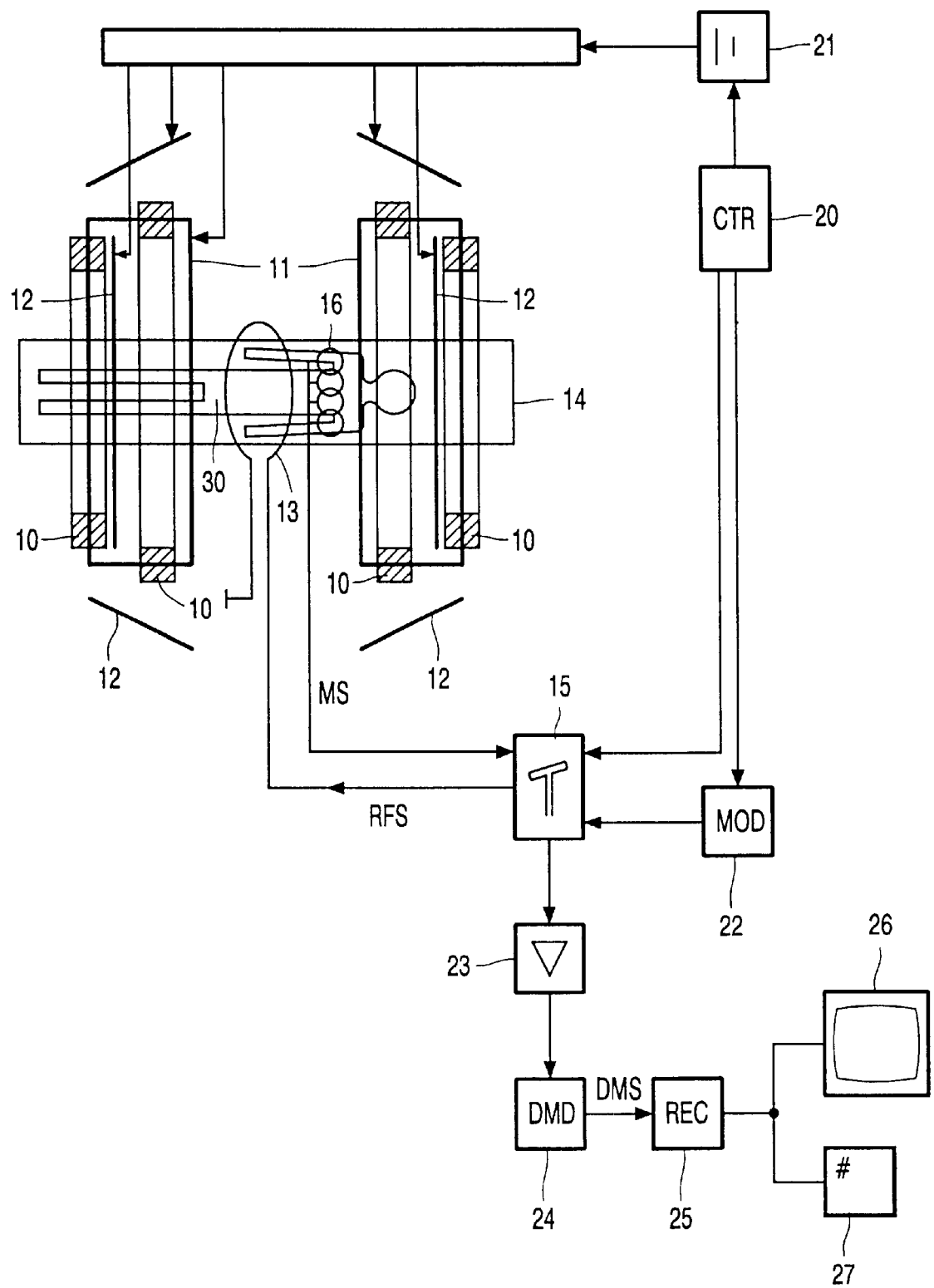

This is a continuation-in-part of application Ser. No. 09/817,097, filed Mar. 26, 2001.

The invention relates to a magnetic resonance imaging method in which the k-space is sampled by the acquisition of magnetic resonance signals.

The invention also relates to a magnetic resonance imaging system that is arranged to carry out such a magnetic resonance imaging method.

A magnetic resonance imaging method and a magnetic resonance imaging system of this kind are known from U.S. Pat. No. 5,713,358.

According to the known magnetic resonance imaging method the k-space is subdivided into central regions and peripheral regions. The central regions are sampled at a higher rate, that is, more often per unit of time, than the peripheral regions. The magnetic resonance image is reconstructed from the most recently acquired magnetic resonance signals from the central regions, supplemented by magnetic resonance signals from peripheral regions that have been acquired somewhat longer ago. The known magnetic resonance imaging method succeeds in faithfully reproducing fast changes of the coarse structures in the magnetic resonance image. For fine structures only slow changes can be faithfully reproduced, because the magnetic resonance signals from the peripheral regions of the k-space, that is, magnetic resonance signals having comparatively large values of the wave number and hence short wavelengths, are refreshed at a low frequency only.

It is an object of the invention to provide a magnetic resonance imaging method that enables the formation of magnetic resonance images that are even more faithful renditions of the object to be imaged.

This object is achieved by means of a magnetic resonance imaging method in accordance with the invention wherein a selected region is adjusted on the basis of a priori known information concerning a part of an object to be imaged, the selected region of the k-space is sampled, and the magnetic resonance image is reconstructed from the magnetic resonance signals that have wave vectors in the sampled selected region in the k-space.

The invention is based on the recognition of the fact that a relationship exists between properties, such as the three-dimensional shape, the dimensions and the temporal contrast variations of or in the part of the object to be imaged and the shape of the region in the k-space with the wave vectors of the magnetic resonance signals of a considerable signal level that are generated by RF excitation in the object to be examined. This is because the magnetic resonance signals represent the Fourier transform of the part of the object to be imaged. The term k-space denotes the reciprocal space of the geometrical space in which the object to be imaged is situated; the k-space is notably the reciprocal space of the geometrical range of the magnetic resonance signals of the receiving antennas, that is, the so-called field of view. Positions in the k-space represent the wave vectors of the magnetic resonance signals. A part of the object that completely and uniformly fills the field of view of the magnetic resonance imaging system generates magnetic resonance signals having wave vectors that are concentrated in a small region at the center of the k-space. A part of the object that is much smaller than the field of view generates magnetic resonance signals that have wave vectors in an extensive region in the k-space. A part of the object that has an elongate three-dimensional shape gives rise to magnetic resonance signals that are concentrated in a region which is oriented in a direction in the k-space that corresponds to the direction that extends transversely of the elongate three-dimensional shape in the geometrical space. The magnetic resonance imaging method in accordance with the invention takes into account the three-dimensional shape of the part of the object to be examined. Consequently, the magnetic resonance imaging method succeeds in accurately sampling, in as far as necessary, the relevant positions in the k-space while avoiding the unnecessary sampling of positions in the k-space. In this context relevant positions in the k-space are to be understood to mean vectorial k values with magnetic resonance signals that are necessary to reconstruct a magnetic resonance image that has a high diagnostic quality and in which small details of low contrast are suitably visibly reproduced. The magnetic resonance imaging method in accordance with the invention thus succeeds in forming magnetic resonance images at a high rate and with a high diagnostic quality.

Preferably, magnetic resonance images of a high diagnostic quality are formed of a patient to be examined.

Furthermore, the scanning or sampling of the selected region constitutes effective filtering in respect of the wave number (or the wavelength) of the magnetic resonance signals; this is because the magnetic resonance signals acquired in the selected region of the k-space constitute a component with a given range of wave numbers of the totality of generated magnetic resonance signals as determined by the choice of the selected region. Effective filtering is thus adjusted by adjustment of the selected region. This adjustable effective filtering enables given structures in the magnetic resonance image to be intensified or suppressed at option.

The invention is particularly suitable for use in conjunction with a three-dimensional magnetic resonance imaging method such as, for example, 3D FFE (Fast Field Echo). During such an FFE sequence magnetic resonance signals are generated by exciting spins in the object to be examined, for example a patient to be examined, by means of an RF pulse which rotates the spins through a given flip angle relative to the steady magnetic field. Successive gradient echoes are then generated by application of a read-out gradient in the read-out direction and by application of mutually perpendicular phase encoding gradients in the direction perpendicular to the read-out gradient. The individual plane in the k-space in which the central region is selected preferably extends perpendicularly to read-out direction. For example, the read-out direction in the k-space is the $k_x$ direction and the individual plane containing the selected region is situated in the $(k_y,k_z)$ plane. The selected region in the k-space is sampled at a comparatively low rate, that is, relative to the sampling rate in the read-out direction, that is, transversely of the plane in which the selected region is situated. At individual points in the selected region (in the $(k_y,k_z)$ plane) each time a large number of points is sampled on a line or line segment in the read-out direction.

These and other aspects of the invention will be elaborated on the basis of the following embodiments which are defined in the dependent claims.

Preferably, the magnetic resonance imaging method in accordance with the invention takes into account the shape and/or the orientation of the part of the object to be imaged in order to select the region to be sampled in the k-space. The selected region to be sampled in the k-space can thus be accurately made to correspond to the Fourier transform of the part of the object to be examined that is to be imaged. Consequently, exactly the magnetic resonance signals that are necessary for the reconstruction of the magnetic resonance image of the part to be imaged are acquired. It has been found that mainly the shape and the orientation of the selected region in the k-space have a strong effect on the adjustment of the effective filter. The intensification of desired parts in the magnetic resonance image and the suppression of undesirable parts in the magnetic resonance image can be suitably controlled on the basis of the shape and the orientation of the selected region in the k-space. This adjustment of the effective filtering is based on the recognition of the fact that usually a difference exists between the shape and orientations of respective parts of the object whose image is either desired or not desired.

Preferably, in accordance with the invention different sampling densities of magnetic resonance signals are used in different directions in the selected region in the k-space. Thus, the signal sampling is preferably concentrated in directions in the k-space in which the magnetic resonance signals are concentrated most in respective of signal level, that is, in directions where there is a comparatively large number of sampling positions at which magnetic resonance signals have a high signal level. This results in an adjustment of the effective filtering which is very compatible with the part of the object to be examined that is to be imaged. Moreover, the invention thus avoids unnecessary sampling in directions in which only few magnetic resonance signals of an acceptable signal level are encountered.

In a preferred implementation of the invention the selected region is preferably a central sector in the k-space that has an anisotropic shape. The central sector is a region in the k-space that comprises the center and a zone around the center. The central sector extends further into the k-space in one or more directions in comparison with the magnitude of the central sector in other directions. Particularly favorable results are obtained when the central sector has an elongate shape. Such an elongate central sector has a major axis in the direction in which the central sector has its largest dimension in the k-space and a minor axis that extends, for example, transversely of the major axis. For example, the minor axis extends in the direction in which the central sector has its smallest dimension. Preferably, the major axis of the central sector extends in a direction in the k-space which corresponds to the direction transversely of the direction in the object in which the main structures in the object to be examined are oriented. The magnetic resonance signals actually represent a Fourier transformed image of the object. For example, when the most important structures of the object are oriented along the x axis, the magnetic resonance signals in the k-space have a high magnitude predominantly along the $k_y$ axis. Notably in the case of MR angiography the major axis is oriented in a direction that corresponds to the direction transversely of the direction of the arteries of the patient to be examined. When such an anisotropic central sector is used, structures that are situated in the direction transversely of the direction of the main structures are effectively suppressed in the magnetic resonance image and the contrast of the oriented main structure is enhanced.

The invention is particularly suitable for use in MR angiography. In the case of MR angiography the patient to be examined is injected with a contrast medium that produces strong magnetic resonance signals, for example after excitation by means of a radio frequency (RF) pulse. The magnetic resonance signals thus generated are used to reconstruct a magnetic resonance image in which a part of the vascular system of the patient to be examined is visible.

In the practice of MR angiography it appears that when the contrast medium reaches the arteries of the patient to be examined, the contrast of the arteries that are filled with the contrast medium increases relative to the surrounding tissue. This means that there is a time-dependent contrast with an increasing section. When a given period of time has elapsed since the contrast medium has reached the arteries, a variation of the concentration of contrast medium occurs in the arteries, be it only slowly as a function of time, and hence also a slow variation of the strength of the magnetic resonance signals from the arteries. It has notably been found that after the contrast reaches the arteries, the concentration of contrast medium in the arteries (the arterial contrast) first increases rapidly and subsequently increases significantly less rapidly until it reaches a maximum value, after which it decreases very slowly again. Approximately from 4 to 8 seconds after the maximum contrast has occurred in the arteries, however, considerable so-called venous enhancement starts to appear in the magnetic resonance images because the contrast medium has meanwhile reached the veins. The period of time of from 4 to 8 seconds between the maximum of the arterial contrast and the beginning of the considerable venous enhancement is also referred to as the arterial window.

When the invention is used for MR angiography, the selected region is preferably a central sector in the k-space. For such an MR angiography application the region to be sampled in the k-space is adjusted on the basis of the shape of the vascular structure of the patient to be examined. In accordance with the invention the sampling of the central sector commences outside the center, that is, preferably before the increase of the arterial contrast. More time is then available for the sampling of the central sector prior to the start of the venous enhancement. The invention also utilizes the fact that in practical MR angiography the time-dependent contrast has a section which slowly varies in time as from an instant just before the contrast in the arteries becomes maximum until the start of the venous enhancement. Because the central sector is sampled separately in accordance with the invention, the center can be easily sampled during the slowly varying section. For example, the peripheral sector is sampled after the sampling of the central sector. When the sampling of the central sector is started outside the center, it can easily be avoided that the sampling of the center takes place exactly while the contrast increases rapidly. Preferably, for the sampling of the central sector it is ensured that the center of the k-space is reached approximately simultaneously with the occurrence of the maximum arterial contrast; however, the sampling may commence before the arterial contrast is maximum. During the sampling of a part of the k-space, such as the central and peripheral sectors, magnetic resonance signals having a wave vector are sampled in the relevant part of the k-space. Because the central sector, and notably the center of the k-space, is sampled while the arterial contrast varies only slowly, no or hardly any "ringing" artifacts will occur in the magnetic resonance images. Moreover, the period of time that is available for the sampling of the central sector is longer, that is, up to about twice as long, than the duration of the arterial window. Furthermore, the arterial contrast is intensified in that the maximum of the concentration of the contrast medium in the arteries occurs during the sampling of the central sector.

Preferably, the orientation of the anisotropic selected region is chosen by adjustment of the orientation of the major axis. The orientation of the major axis determines predominantly the orientation of the selected anisotropic region; this is the case notably when the anisotropic central sector is used as the selected region to be sampled in the k-space. The aspect ratio, being the ratio of the length of the major axis to that of the minor axis of the anisotropic region, mainly determines the shape of the anisotropic region. Consequently, it usually suffices to adjust the aspect ratio so as to control the shape of the selected region to be sampled in the k-space. In an MR angiography application the orientation of the selected region to be sampled in the k-space, notably the anisotropic central sector in the k-space, is preferably chosen on the basis of the direction in which the vascular structure of the patient to be examined mainly extends.

Another suitable choice for the anisotropic region is a more or less butterfly-shaped region in the k-space. It has been found that when such a butterfly-shaped region is sampled, the magnetic resonance signals which are generated in a slightly curved or bent part of the object to be examined are accurately sampled. The sampling of such a butterfly-shaped region offers favorable results in particular for the imaging of blood vessels in the patient to be examined. Upon examination of the vascular system in the neck (the carotids) of the patient to be examined, the major axis of the central sector is adjusted in the direction that corresponds to the direction transversely of the arteries in, for example the neck of the patient to be examined. The venous signal in the vicinity of the carotids of the patient to be examined is thus effectively suppressed.

As a result of the effective filtering, the invention achieves suppression of magnetic resonance signals from the veins (the venous signals) relative to the magnetic resonance signals from the arteries because, generally speaking, the veins and arteries do not extend in the same directions. As a result of such suppression of the venous signals, the acquisition of magnetic resonance signals can be continued even when the contrast medium has already reached the veins, that is, without serious venous enhancement becoming visible in the reconstructed magnetic resonance image. The rendition of the arteries in the magnetic resonance image is thus intensified, that is, without giving rise to an annoying reproduction of a part of the veins.

In accordance with the invention it is necessary to have a priori known information concerning the part to be imaged available. MR angiography notably requires the availability of predetermined information concerning the shape of the relevant part of the vascular structure of the patient to be examined. Such information can be derived, for example, by performing an exploratory acquisition of magnetic resonance signals in advance. Such exploratory magnetic resonance signals relate, for example, to a thick slice through the part of the patient to be examined. For example, a so-called fluoroscopic magnetic resonance image of the relevant thick slice is formed from such exploratory magnetic resonance signals. Such a fluoroscopic magnetic resonance image need not have a high diagnostic quality; it suffices for the fluoroscopic magnetic resonance image to show the direction in which the structures, for example, the blood vessels extend in the region to be examined.

The sampling of the selected region can be performed in various ways. An easy method of sampling consists in the sampling of the selected region along parallel line segments in the k-space. It is also possible to sample the selected region along, for example, a spiral-shaped trajectory through the k-space, first the center of the k-space being sampled and subsequently the parts that are situated further outwards in the selected region. Notably for MR angiography it is thus achieved that magnetic resonance signals are acquired from the center of the k-space before the contrast medium has reached the veins of the patient to be examined. Venous enhancement is thus avoided in the magnetic resonance image. The sampling of the selected anisotropic region along a spiral-shaped trajectory which extends outwards from the center in the k-space also offers favorable results in other situations involving time-dependent contrast. Such time-dependent contrast occurs, for example when the (nuclear) spins are saturated in a part of the object to be examined. Another example is lipid suppression by means of a lipid-selective saturation pre-pulse. Such saturation is performed, for example by way of a strong RF excitation in co-operation with a magnetic selection gradient. Because of such saturation, the relevant saturated region does not produce any or hardly any magnetic resonance signals, so that the effect of such a saturated region on the magnetic resonance image can be excluded or counteracted. It has been found that despite the saturation of the relevant region, magnetic resonance signals that increase in time and cause a time-dependent contrast still arise. Disturbing effects of such a time-dependent contrast are reduced in the magnetic resonance image by sampling the anisotropic selected region in the k-space in the direction away from the center in the k-space, that is, preferably along a spiral-shaped trajectory from the center in the k-space to the edge of the anisotropic region. Moreover, in that case it will not be necessary, or at least less frequently necessary, to saturate the relevant region time and again.

Furthermore, the sampling of the selected region can be limited in one or more directions. Because only a part of the selected region is actually scanned, it is necessary to use a partial Fourier reconstruction that is known per se for the reconstruction of the magnetic resonance image. Magnetic resonance signals for the parts of the selected region that have not been sampled are then derived, for example by hermitic conjugation, from magnetic resonance signals that have been measured.

The invention also relates to a magnetic resonance imaging system which is suitable for carrying out the magnetic resonance imaging method in accordance with the invention. Such a magnetic resonance imaging system in accordance with the invention is defined in claim 8.

The invention also relates to a computer program. The computer program in accordance with the invention comprises instructions for sampling the k-space by acquisition of magnetic resonance signals, for adjusting a selected region on the basis of a priori known information concerning a part of an object to be imaged, and for sampling the selected region of the k-space.

The magnetic resonance imaging system includes a computer whereby the various functions of the magnetic resonance imaging system can be executed. Loading the computer program in accordance with the invention into the computer of the magnetic resonance imaging system enables execution of the method of the invention by means of such a system. For example, the computer program can be loaded into the working memory of the magnetic resonance imaging system from a carrier, for example a CD-ROM disc, but it is also possible to download the computer program in accordance with the invention via a network such as the worldwide web.

Figure 2:
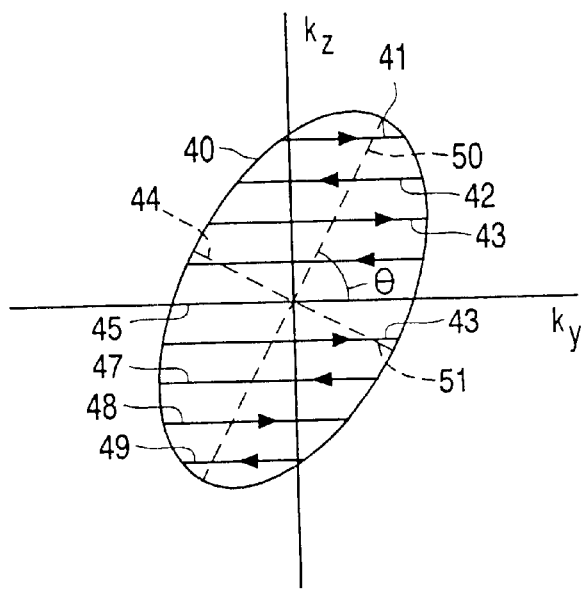
Figure 3A:
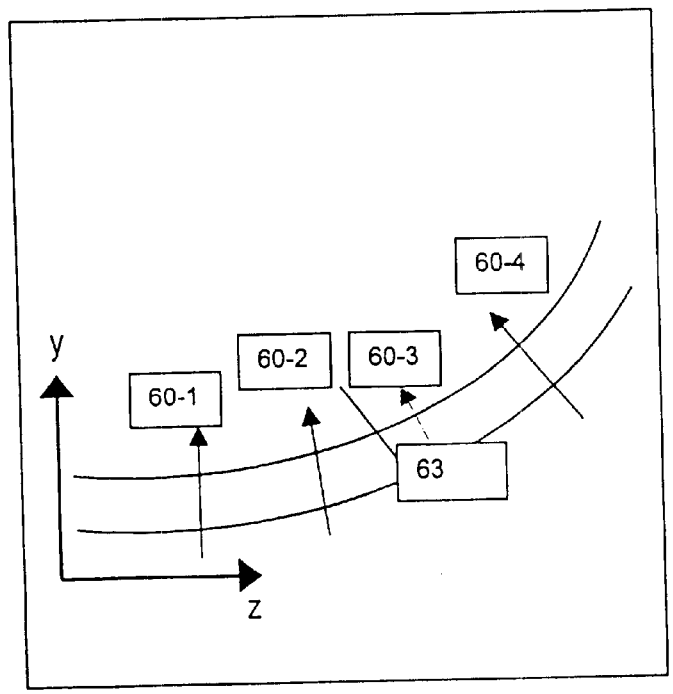
Figure 3B:
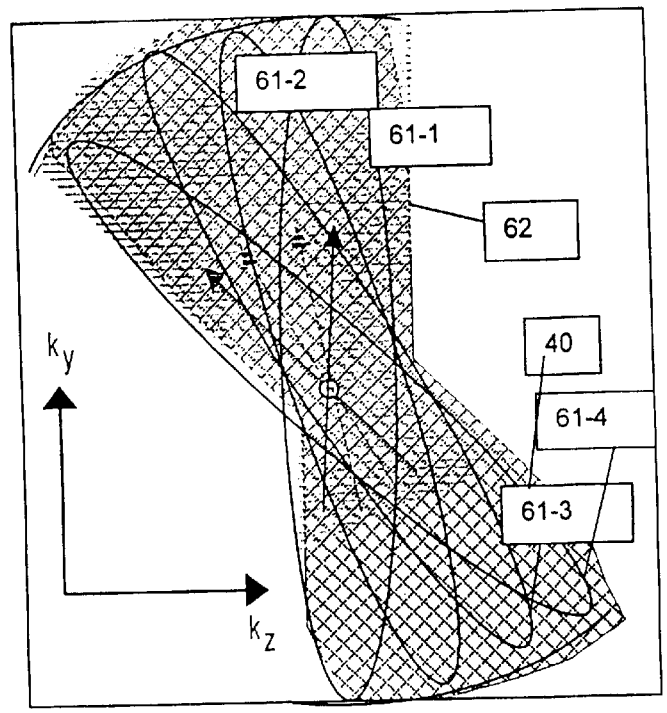
Figure 4:
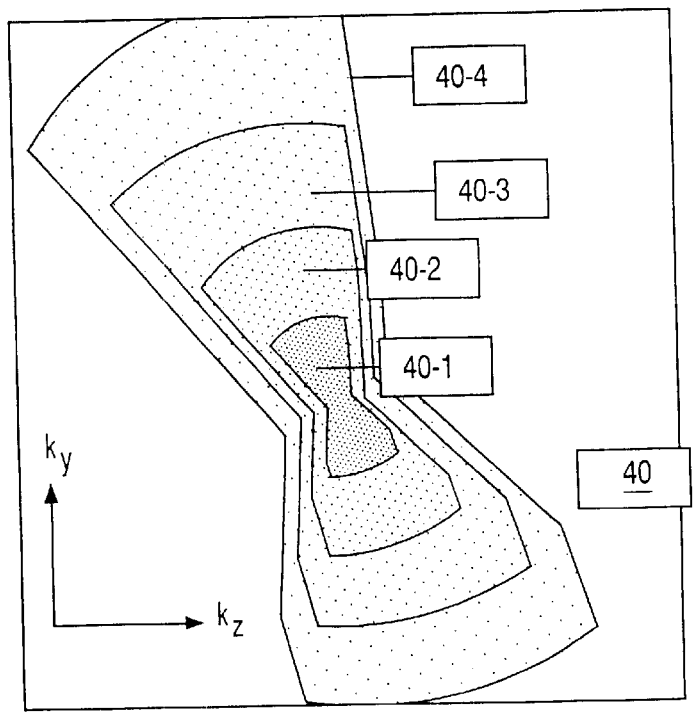

These and other aspects of the invention will be described in detail hereinafter, by way of example, with reference to the following embodiments and the accompanying drawing; therein:

FIG. 1 shows diagrammatically a magnetic resonance imaging system in which the invention is used, FIG. 2 shows graphically an example of an acquisition trajectory through the k-space that is used in accordance with the invention, FIG. 3a shows graphically an example of a curved structure and FIG. 3b shows graphically a suitable butterfly-shaped selected region to be sampled in the k-space, and FIG. 4 shows graphically an advantageous method of sampling the butterfly-shaped region of FIG. 3b.

FIG. 1 shows diagrammatically a magnetic resonance imaging system in which the invention is used. The magnetic resonance imaging system includes a system of main coils 10 whereby the steady, uniform magnetic field is generated. The main coils are constructed, for example, in such a manner that they enclose a tunnel-shaped examination zone. The patient to be examined is transported into said tunnel-shaped examination zone. The magnetic resonance imaging system also includes a number of gradient coils 11, 12 whereby magnetic fields with spatial variations, notably in the form of temporary gradients in separate directions, are superposed on the uniform magnetic field. The gradient coils 11, 12 are connected to a variable power supply unit 21. The gradient coils 11, 12 are energized by applying a current thereto by means of the power supply unit 21. The strength, the direction and the duration of the gradients are controlled by control of the power supply unit. The magnetic resonance imaging system also includes transmission and receiving coils 13, 15 for generating the RF excitation pulses and for collecting the magnetic resonance signals, respectively. The RF excitation pulses excite nuclear spins or electron spins in the object to be examined, for example the patient to be examined, that is, the spins are brought into an excited state. After the RF excitation of the spins, the spins relax from the excited state to the basic state while emitting RF magnetic resonance signals. Spatial encoding of the magnetic resonance signals is provided by way of gradient fields. Furthermore, RF refocusing pulses or gradient pulses can be used so as to generate magnetic resonance echo signals. The transmission coil 13 is preferably constructed as a body coil 13 whereby (a part of) the object to be examined can be enclosed. The body coil is usually arranged in the magnetic resonance imaging system in such a manner that the patient 30 to be examined is situated within the body coil 13 when accommodated in the magnetic resonance imaging system. The body coil 13 acts as a transmission antenna for transmitting the RF excitation pulses and RF refocusing pulses. The body coil 13 preferably provides a spatially uniform intensity distribution of the transmitted RF pulses. Usually the same coil or antenna is used alternately as a transmission coil and as a receiving coil. Furthermore, the transmission and receiving coil is usually shaped as a coil, but other geometries where the transmission and receiving coil acts as a transmission and receiving antenna for RF electromagnetic signals are also feasible. The transmission and receiving coil 13 is connected to an electronic transceiver circuit 15.

However, it is to be noted that it is alternatively possible to use separate receiving coils 16. For example, surface coils 16 can then be used as receiving coils. Such surface coils have a high sensitivity in a comparatively small volume. The transmission coils, such as the surface coils, are connected to a demodulator 24 and the magnetic resonance signals (RFS) received are demodulated by means of the demodulator 24. The demodulated magnetic resonance signals (DMS) are applied to a reconstruction unit. The receiving coil is connected to a pre-amplifier 23. The pre-amplifier 23 amplifies the RF resonance signal (RFS) received by the receiving coil and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transceiver circuit 15 is connected to a modulator 22. The modulator 22 and the transceiver circuit 15 activate the transmission coil 13 so as to transmit the RF excitation and refocusing pulses. The reconstruction unit derives one or more image signals from the demodulated magnetic resonance signals (DMS); such image signals represent the image information of the imaged part of the object to be examined. In practice the reconstruction unit 25 is preferably constructed as a digital image processing unit 25 which is programmed to derive from the demodulated magnetic resonance signals the image signals that represent the image information of the part of the object to be imaged. The signal at the output of the reconstruction unit is applied to a monitor 26 so that the magnetic resonance image can be displayed on the monitor. The magnetic resonance signals can also represent a three-dimensional density distribution. Such a three-dimensional density distribution can be displayed on the monitor in various ways; for example, projections to be selected by the user are reproduced or stereoscopic pairs of images are displayed. It is alternatively possible to store the signal from the reconstruction unit in a buffer unit 27 while awaiting further processing.

The magnetic resonance imaging system in accordance with the invention also includes a control unit 20, for example in the form of a computer with a (micro) processor. The control unit 20 controls the execution of the RF excitations and the application of the temporary gradient fields. To this end, for example, the computer program in accordance with the invention is loaded into the control unit 20.

FIG. 2 shows graphically an example of an acquisition trajectory through the k-space that is used in accordance with the invention. FIG. 2 notably shows such an acquisition trajectory in the ($k_y$,$k_z$) plane. The selected region 40 is, for example an elliptical central sector in the k-space in which the center O of the k-space is situated. In the selected region 40 points are sampled on a number of line segments 41 to 49. The sampling commences, for example, at the edge of the selected region; for example, first the line segment 41 is sampled, and after some time the center (O) of the ($k_y$,$k_z$) plane on the line segment 43 is sampled. The orientation of the selected region is determined by the orientation of the major axis 50. The orientation of the major axis 50 is represented by the angle θ enclosed by the major axis relative to the $k_y$ axis. The shape of the selected region is determined by the ratio of the major axis 50 to the minor axis.

FIG. 3a shows graphically an example of a curved structure and FIG. 3b is a graphic representation of a suitable butterfly-shaped selected region to be sampled in the k-space. FIG. 3a shows a curved part of an object 63, for example a bend in a blood vessel, in a plane (the y-z plane) in space. The local directions that extend transversely of the part of the object 63 are denoted by the arrows. In FIG. 3b the regions 61-1,2,3,4 of wave vectors where the individual regions 60-1,2,3,4 in FIG. 3a produce magnetic signals are indicated in the $k_y$-$k_z$ plane in the k-space. The region 60-1 in FIG. 3a is oriented mainly along the z axis, so that locally the direction transversely of the region 60-1 is directed approximately in the y direction. Consequently, the region 60-1 yields magnetic resonance signals with wave vector components in the more or less elliptical region 61-1 whose longitudinal axis extends mainly in the $k_y$ direction. The regions 60-2,3,4 correspond to the elliptical regions 61-2,3,4 whose direction in the k-space is approximately the same as the direction in the space transversely of the direction of the regions 60-2,3,4. This clearly shows that the set of ellipses 61-1,2,3,4 is suitable for use as the selected region 40 to be sampled in the k-space. When use is made of the known partial Fourier technique also, it suffices to sample, for example a part 62 of the region 40. It has been found that the magnetic resonance signals from the selected region 40 or 62 suffice to reconstruct the magnetic resonance image in which the edges of the curved part of the object are reproduced with a suitable spatial resolution.

FIG. 4 shows graphically an advantageous method of sampling the butterfly-shaped region in FIG. 3*b*. FIG. 4 again shows the selected region 40 in the $k_y$-$k_z$ plane in the k-space. The selected region is sampled in successive parts 40-1, 40-2, 40-3, 40-4. As the part to be sampled is situated further from the center of the k-space, it will be sampled later. As the gray tone of the part shown in FIG. 4 is lighter, it will be sampled later. The individual parts have more or less a boundary which must be as similar as possible to the boundary of the selected region 40. The part to be sampled can thus be readily adjusted; this also holds for the temporary magnetic gradient fields required for this purpose.

What is claimed is:

1. A magnetic resonance imaging method, including the steps of:
    sampling k-space by the acquisition of magnetic resonance signals,
    adjusting a selected region in k-space on the basis of a priori known information concerning a 3-D shape and/or orientation of a part of an object to be imaged,
    sampling the selected region of the k-space in correspondence to the shape and/or orientation of the part of the object to be imaged, and
    reconstructing a magnetic resonance image from magnetic resonance signals that have wave vectors in the sampled selected region in the k-space.

2. A magnetic resonance imaging method as claimed in claim 1, wherein the sampling densities in the selected region are adjusted in respective directions in the k-space on the basis of the a priori known information concerning the 3-D shape and/or orientation of the part to be imaged.

3. A magnetic resonance imaging method as claimed in claim 1, wherein the selected region has an anisotropic shape, the selected region in the k-space extending along a major axis over a distance which is larger than its distance along a minor axis that is perpendicular to the major axis.

4. A magnetic resonance imaging method, notably an MR angiography method, as claimed in claim 3, wherein the selected region is a central sector in the k-space.

5. A magnetic resonance imaging method as claimed in claim 3, wherein the orientation of the major axis of the selected region and/or the aspect ratio of the major axis to the minor axis is adjusted on the basis of information concerning the shape of the part of the object to be imaged.

6. A magnetic resonance imaging method as claimed in claim 1, wherein the a priori known information concerning the 3-D shape and/or orientation of the object to be imaged is derived from an exploratory acquisition of magnetic resonance signals.

7. A computer program with instructions for implementing a method for magnetic resonance imaging comprising the following steps:
    sampling the-k-space by the acquisition of magnetic resonance signals,
    adjusting a selected region of the k-space on the basis of a priori known information concerning a shape and/or orientation of a part of an object to be imaged,
    sampling the selected region of the k-space in correspondence to the shape and/or orientation of the part of the object to be imaged; and
    reconstructing the magnetic resonance image from the magnetic resonance signals having wave vectors in the sampled selected region in the k-space.

8. A magnetic resonance imaging system comprising a system of main coils, a system of gradient coils, a system of transmit and receive coils, a power supply system, a demodulating unit, a reconstruction unit and a control unit,
    which magnetic resonance imaging system is arranged to sample the k-space by acquisition of magnetic resonance signals,
    wherein the control system adjusts a selected region of the k-space on the basis of a priori known information concerning a shape and/or orientation of a part of an object to be imaged, and causes
    the selected region of the k-space to be sampled in correspondence to the shape and/or orientation of the part of the object to be imaged, and
    wherein the reconstruction unit reconstructs the magnetic resonance image from the magnetic resonance signals having wave vectors in the sampled selected region in the k-space.

* * * * *